(12) United States Patent
Wu et al.

(10) Patent No.: US 11,837,662 B2
(45) Date of Patent: Dec. 5, 2023

(54) DEVICES WITH STRAINED ISOLATION FEATURES

(71) Applicant: Taiwan Semiconductor Manufacturing Co., Ltd., Hsinchu (TW)

(72) Inventors: Xusheng Wu, Hsinchu (TW); Chang-Miao Liu, Hsinchu (TW); Huiling Shang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 244 days.

(21) Appl. No.: 17/122,209

(22) Filed: Dec. 15, 2020

(65) Prior Publication Data

US 2021/0104631 A1    Apr. 8, 2021

Related U.S. Application Data

(63) Continuation of application No. 16/441,071, filed on Jun. 14, 2019, now Pat. No. 10,868,174.

(51) Int. Cl.
| | |
|---|---|
| *H01L 21/70* | (2006.01) |
| *H01L 29/78* | (2006.01) |
| *H01L 27/092* | (2006.01) |
| *H01L 21/762* | (2006.01) |
| *H01L 21/8238* | (2006.01) |

(52) U.S. Cl.
CPC .... *H01L 29/7846* (2013.01); *H01L 21/76224* (2013.01); *H01L 21/823821* (2013.01); *H01L 21/823878* (2013.01); *H01L 27/0924* (2013.01)

(58) Field of Classification Search
CPC ......... H01L 29/7846; H01L 21/76224; H01L 21/823821; H01L 21/823878; H01L 27/0924
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |

(Continued)

*Primary Examiner* — Victor A Mandala
*Assistant Examiner* — Colleen E Snow
(74) *Attorney, Agent, or Firm* — HAYNES AND BOONE, LLP (57) ABSTRACT

A semiconductor device and a method of forming the same are provided. A semiconductor device of the present disclosure includes a first fin including a first source/drain region, a second fin including a second source/drain region, a first isolation layer disposed between the first source/drain region and the second source/drain region, and a second isolation layer disposed over the first isolation layer. A first portion of the first isolation layer is disposed on sidewalls of the first source/drain region and a second portion of the first isolation layer is disposed on sidewalls of the second source/drain region. A portion of the second isolation layer is disposed between the first portion and second portion of the first isolation layer.

20 Claims, 9 Drawing Sheets

(56) References Cited

U.S. PATENT DOCUMENTS

2017/0154991 A1 6/2017 Ko et al.
2019/0067478 A1 2/2019 Chu et al.
2019/0164890 A1 5/2019 Yeoh et al.

DEVICES WITH STRAINED ISOLATION FEATURES

PRIORITY DATA

The present application is a continuation application of U.S. patent application Ser. No. 16/441,071, filed Jun. 13, 2019, which is herein incorporated by references in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling down has also increased the complexity of processing and manufacturing ICs and, for these advances to be realized, similar developments in IC processing and manufacturing are needed. For example, a three-dimensional transistor, such as a fin-like field-effect transistor (FinFET), has been introduced to replace a planar transistor. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of ways, and in some applications, FinFETs provide reduced short channel effects, reduced leakage, and higher current flow. In other words, they may be faster, smaller, and more efficient than planar devices.

FinFETs may include stressor structures that exert stress on channel regions of fins in order to improve performance thereof by increasing electron mobility or hole mobility in these channel regions. While conventional stressor structures are generally adequate for their intended purposes, they have not been entirely satisfactory in all respects. For example, some of the stressor structures may undergo stress relaxation and become less effective in exerting stress on the channel regions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a stressor structure that exerts stress on channel regions of FinFETs to improve device performance. In particular, the present disclosure is directed to an isolation structure that exerts tensile stress on channel regions of FinFETs in an n-type device region to increase electron mobility therein. In some embodiments, the isolation structure includes a first isolation layer having a recess and a second isolation layer disposed over the first isolation layer and within the recess in the first isolation layer. The isolation structure is disposed around source/drain regions of n-type FinFETs. After compressive strain is induced in the second isolation layer that wraps around the fin structures, tensile stress exerted on the source/drain regions may result in tensile stress on the channel regions adjacent the source/drain regions.

To illustrate the various aspects of the present disclosure, a FinFET fabrication process is discussed below as an example. In that regard, the FinFET device has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure, but it is understood that the application is not limited to the FinFET device, except as specifically claimed.

Figure 1:
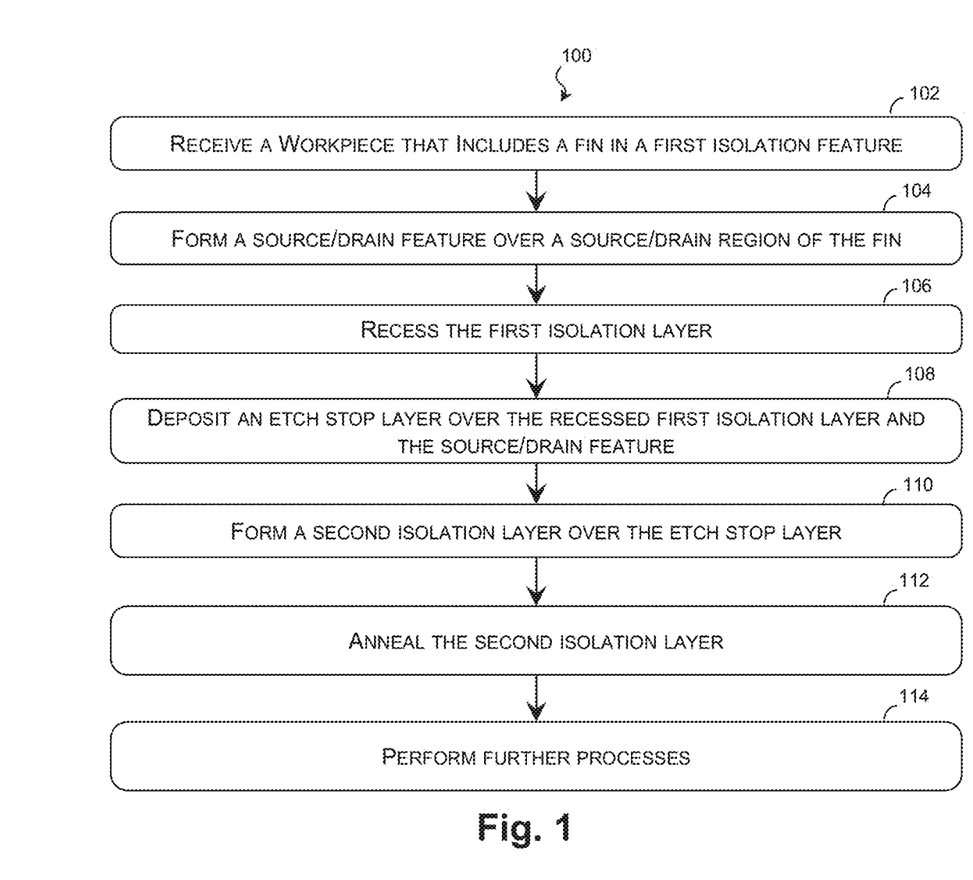
FIG. 1 is a flow diagram of a method for fabricating a semiconductor device according to various aspects of the present disclosure.

FIG. 1 illustrates a flow chart of a method 100 for fabricating a semiconductor device. At block 102 of the method 100, a workpiece is provided. The workpiece includes a fin in a first isolation layer. At block 104 of the method 100, a source/drain feature is formed over a source/drain region of the fin. At block 106 of the method 100, the first isolation layer is recessed. At block 108 of the method 100, an etch stop layer is deposited over the recessed first isolation layer and the source/drain feature. At block 110 of the method 100, a second isolation layer is formed over the etch stop layer. At block 112 of the method 100, the second isolation layer is annealed. At block 114 of the method 100, further processes may be performed to complete fabrication of the semiconductor device. While operations in method 100 are labeled using reference numerals in a substantially sequential order, the present disclosure is not so limited and the method 100 may include various embodiment. Unless otherwise specified herein, additional steps can be provided before, during, and after the method 100, and some of the steps described can be replaced or eliminated for other embodiments of the method 100.

Figure 2:
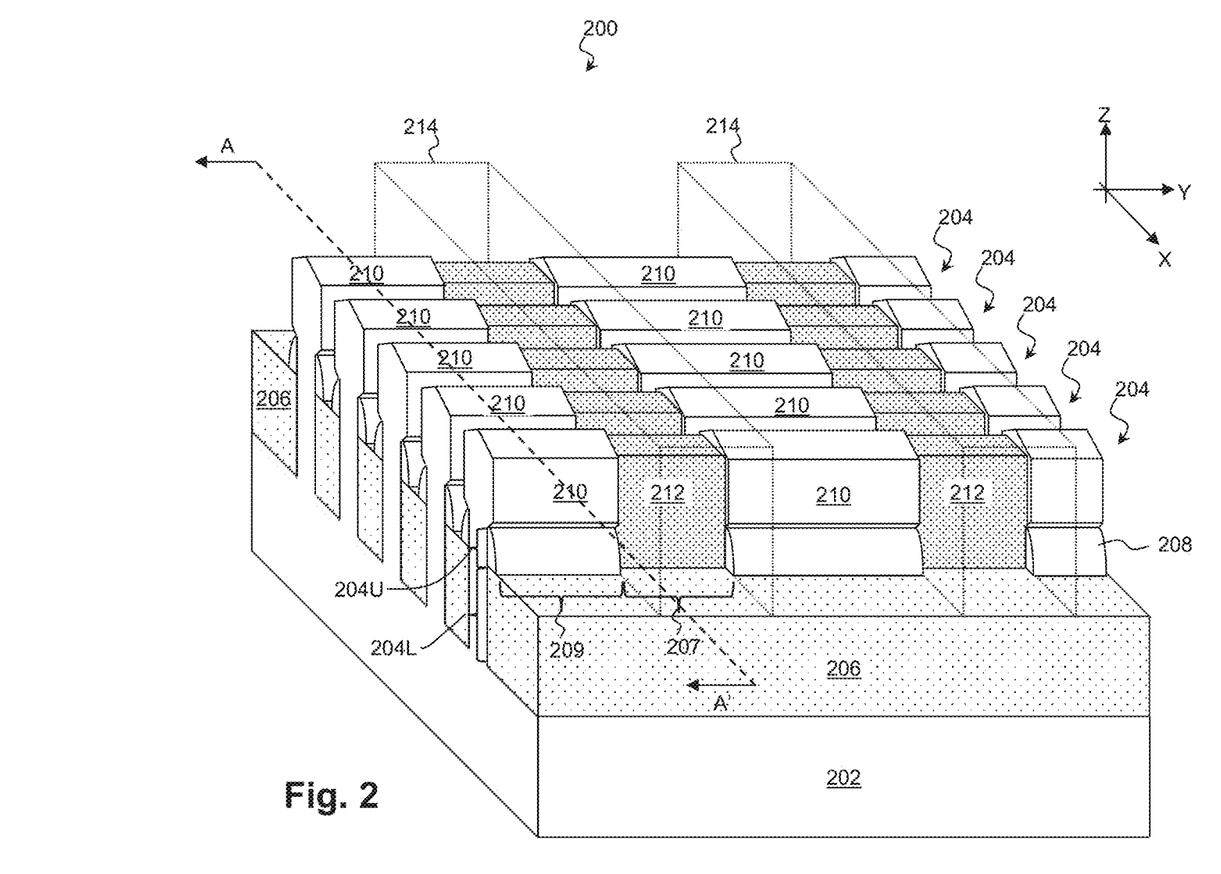
FIG. 2 is a perspective diagrammatic view of a workpiece according to various aspects of the present disclosure.

Blocks of the method 100 in FIG. 1 may be better described in conjunction with FIGS. 2-8. Referring now to FIGS. 1 and 2, the method 100 include a block 102 where a workpiece 200 is provided. FIG. 2 is a perspective diagrammatic view of the workpiece 200, according to some embodiments of the present disclosure. The workpiece 200 can be included in a microprocessor, a memory, and/or other IC device. In some implementations, workpiece 200 is a portion of an IC chip, a system on chip (SoC), or portion thereof, that includes various passive and active microelectronic devices, such as resistors, capacitors, inductors, diodes, p-type field effect transistors (PFETs), N-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 3-8 are fragmentary cross-sectional diagrammatic views along section A-A' of a workpiece 200 at various fabrication stages of a method of the present disclosure, such as method 100 of FIG. 1. FIGS. 2-8 have been simplified for the sake of clarity to better understand the inventive concepts of the present disclosure. Additional features can be added in workpiece 200, and some of the features described below can be replaced, modified, or eliminated in other embodiments of workpiece 200.

The workpiece 200 includes a substrate 202. The substrate 202 may be made of silicon or other semiconductor materials. Alternatively or additionally, the substrate 202 may include other elementary semiconductor materials such as germanium. In some embodiments, the substrate 202 is made of a compound semiconductor such as silicon carbide, gallium arsenic, indium arsenide, or indium phosphide. In some embodiments, the substrate 202 is made of an alloy semiconductor such as silicon germanium, silicon germanium carbide, gallium arsenic phosphide, or gallium indium phosphide. In some embodiments, the substrate 202 includes an epitaxial layer. For example, the substrate 202 may include one or more epitaxial layers overlying a bulk semiconductor.

The workpiece 200 also includes one or more fin structures 204 (e.g., Si fins or fins) that extend from the substrate 202 in the Z-direction. The fin structures 204 extend or are elongated along the X-direction and may optionally include germanium (Ge). The fin structures 204 may be formed by using suitable processes such as photolithography and etching processes. In some embodiments, the fin structure 204 is etched from the substrate 202 using dry etch or plasma processes. In some other embodiments, the fin structure 204 can be formed by a double-patterning lithography (DPL) process, a quadruple-patterning lithography (QPL) process or a multiple-patterning lithography (MPL) process. Generally, DPL, QPL and MPL processes combine photolithography and self-aligned processes, allowing patterns to be created that have, for example, pitches smaller than what is otherwise obtainable using a single, direct photolithography process.

A first isolation layer 206, such as a shallow trench isolation (STI) structure, is formed to surround and among the fin structures 204 such that a lower portion 204L of the fin structure 204 is covered/buried/embedded in the first isolation layer 206 and an upper portion 204U that protrudes from and above the first isolation layer 206. The upper portion 204U is smaller than the lower portion 204L. In some embodiments, a height of the upper portion 204U measured from the substrate is between about 2 nm and about 20 nm and a height of the lower portion 204L measured from the substrate is between about 20 nm and about nm. In those embodiments, the height of the upper portion 204U is between about 5% and about 50% of the height of the lower portion 204L. The first isolation layer 206 may also be referred to as STI 206. As shown in FIG. 2, the first isolation layer 206 is on top surfaces of the substrate 202 and in direct contact with sidewalls of the lower portion 204L of the fin structure 204. Each of the fin structures 204 may include a channel region 207 and a source/drain region 209 adjacent the channel region 207. In some embodiments illustrated in FIG. 2, one or more gate structures 214 may be formed over and around the channel region(s) 207 and the source/drain features 210 may be formed over and around the source/drain region(s) 209. The first isolation layer 206 prevents electrical interference or crosstalk and may be referred to as STI 206.

Depending on the process, the gate structure 214 may be a dummy gate structure (or placeholder gate structure) or a functional metal gate structure. When the gate structure 214 is a dummy gate structure in a gate-last process, the workpiece 200 may include a dummy gate dielectric layer 212 between the gate structure 214 and the fin structures 204. In the gate-last process, the dummy gate structure and the dummy gate dielectric layer will be replaced with a gate dielectric layer and a metal gate structure. When the gate structure 214 is a functional gate structure in a gate-first process, the workpiece 200 may include a gate dielectric layer between the gate structure 214 and the fin structures 204. The gate structure 214 may include polysilicon when it is a dummy gate structure or metal (or metal nitride) when it is a functional metal gate structure. Such metal (or metal nitride) includes tantalum nitride (TaN), nickel silicide (NiSi), cobalt silicide (CoSi), molybdenum (Mo), copper (Cu), tungsten (W), aluminum (Al), nickel (Ni), cobalt (Co), zirconium (Zr), platinum (Pt), ruthenium (Ru), or other applicable materials.

The gate dielectric layer may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. In some embodiments, the gate structure 214 includes additional layers, such as interfacial layers, capping layers, diffusion/barrier layers, or other applicable layers.

The gate structure 214 may be formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

In some embodiments, the gate structures 214 may include one or more spacers. In some embodiments, the gate structures 214 are first formed over the channel region 207 of the fins 204 before the source/drain features 210 are formed. After the gate structures 214, which may be dummy gate structures, are formed, one or more spacer layers are then deposited over the workpiece 200 to cover the gate structures 214 and the source/drain region 209 of the fin structure. In some embodiments, the one or more spacers may include a spacer 208 disposed over the sidewalls of the fin structures 204. In the embodiments represented in FIG. 2, after the one or more spacers are deposited, the source/drain region 209 of the fin structure 204 are recessed ahead of the epitaxy process for formation the source/drain features 210. In those embodiments, the spacer 208 is recessed such that it covers sidewalls of the upper portion 204U of the fin structure 204. Because the epitaxy process to form the source/drain features 210 only forms epitaxy on the fin structure 204, the spacer 208 allows the source/drain feature 210 to be vertically spaced apart along the Z direction from a top surface of the first isolation layer 206.

The one or more spacers, including the spacer 208, may include silicon, oxygen, nitrogen, and/or carbon and may be silicon oxide, silicon nitride, silicon oxynitride, or silicon oxycarbonitride, silicon carbonitride. In some embodiments, the spacer 208 and the first isolation layer 206 may be formed of different dielectric materials to experience different etching rate when etched by the same etchant. For example, the spacer 208 may be formed of silicon nitride while the first isolation layer 206 is formed of silicon oxide. In that example, the first isolation layer 206 may be selectively etched while the spacer 208 is substantially unetched. In that regard, the spacer 208 may serve as an etch mask or an etch stop layer for the etching/recessing of the first isolation layer 206 disposed directly under the spacer 208.

Figure 3:
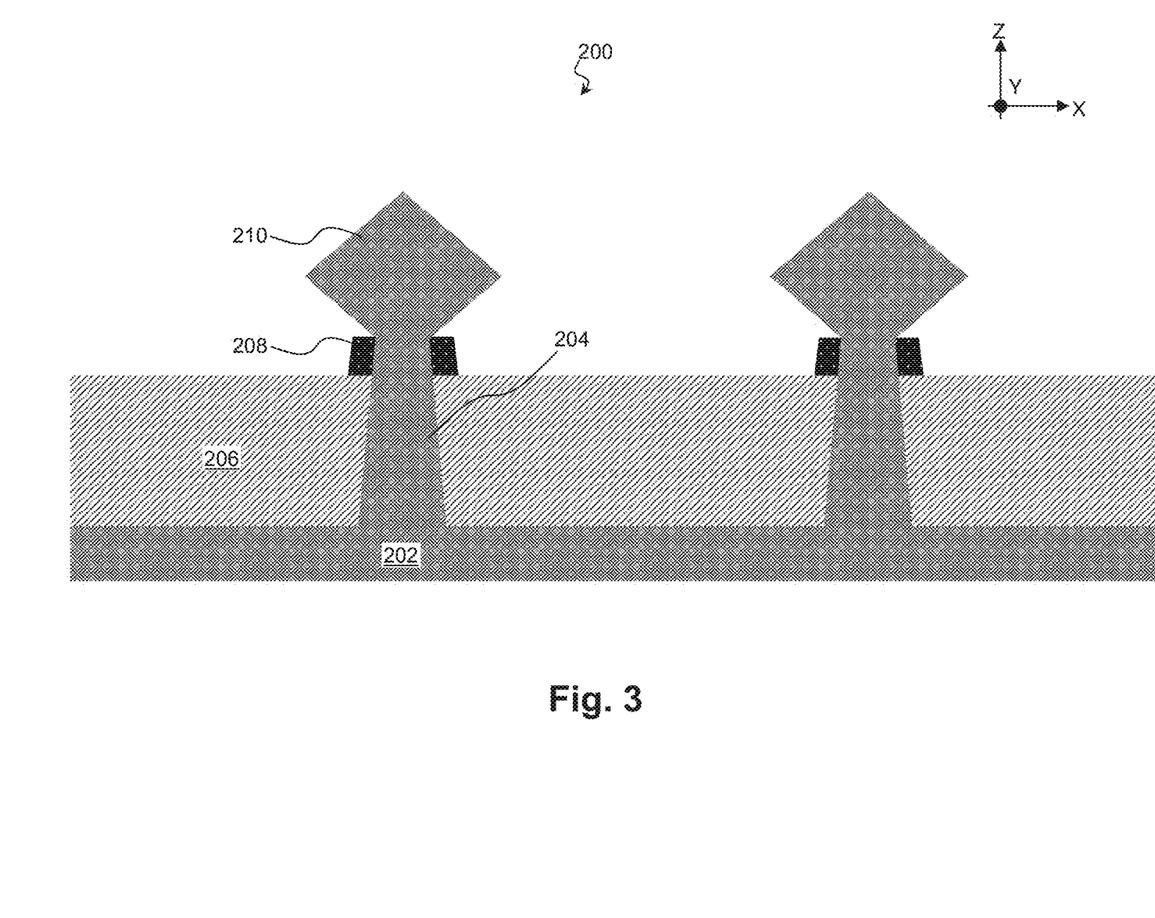
FIGS. 3-8 are fragmentary cross-sectional diagrammatic views of a workpiece at various fabrication stages of a method, such as the method in FIG. 1, according to various aspects of the present disclosure.
Figure 8:
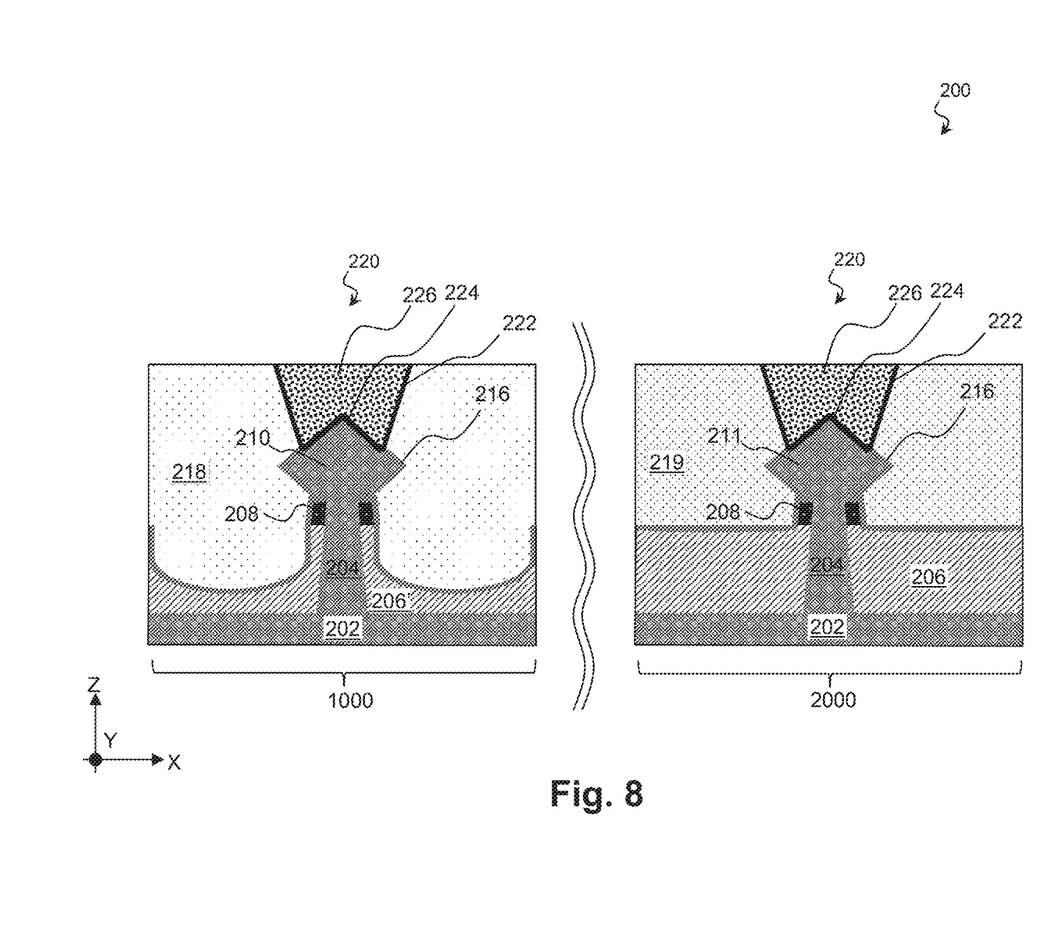

Referring now to FIGS. 1, 2 and 3, the method 100 includes a block 104 where the source/drain feature 210 is formed over the source/drain region 209 of the fin structure 204. In is noted that while not specifically shown, the workpiece 200 includes an n-type device region and a p-type device region and each of the n-type and p-type device regions includes one or more fin structures 204. In some embodiments, FIGS. 3-7 illustrate only the n-type device region, which may or may not be formed adjacent a p-type device region; and FIG. 8 illustrates source/drain regions of both the n-type deice region and the p-type device region. In some embodiments, the source/drain features 210 over the n-type device region and the source/drain features over the p-type device region are formed separately. For example, a hard mask layer is first deposited using CVD, ALD, spin-on coating, or other suitable deposition techniques in a blanket manner over the workpiece 200, including over the n-type device region and the p-type device region. The hard mask is then patterned using photolithography techniques. For instance, a photoresist layer, which may include multiple material layers, may be deposited over the hard mask. The photoresist layer is then exposed to radiation reflected from or going through a patterned mask. After being subject to a post-exposure bake, the exposed photoresist layer may undergo chemical changes that allow the exposed or the unexposed portions of the photoresist layer to be removed by a developer to form a patterned photoresist layer. The hard mask, which is not masked by the patterned photoresist layer is then removed to form a patterned hard mask that exposes source/drain regions of one of the device regions. Similar processes are then repeated to form another patterned hard mask that exposes source/drain regions of the other device region. Separately forming n-type source/drain features and p-type source/drain features allows for individualized performance tuning by applying different epitaxial compositions, different dopant concentrations, different dopant species, different stressor structures to source/drain features of different types. In some embodiments, operations of method 100 of the present disclosure are only applied to n-type device regions to form a stressor structure that boosts performance of the n-type devices.

Figure 4:
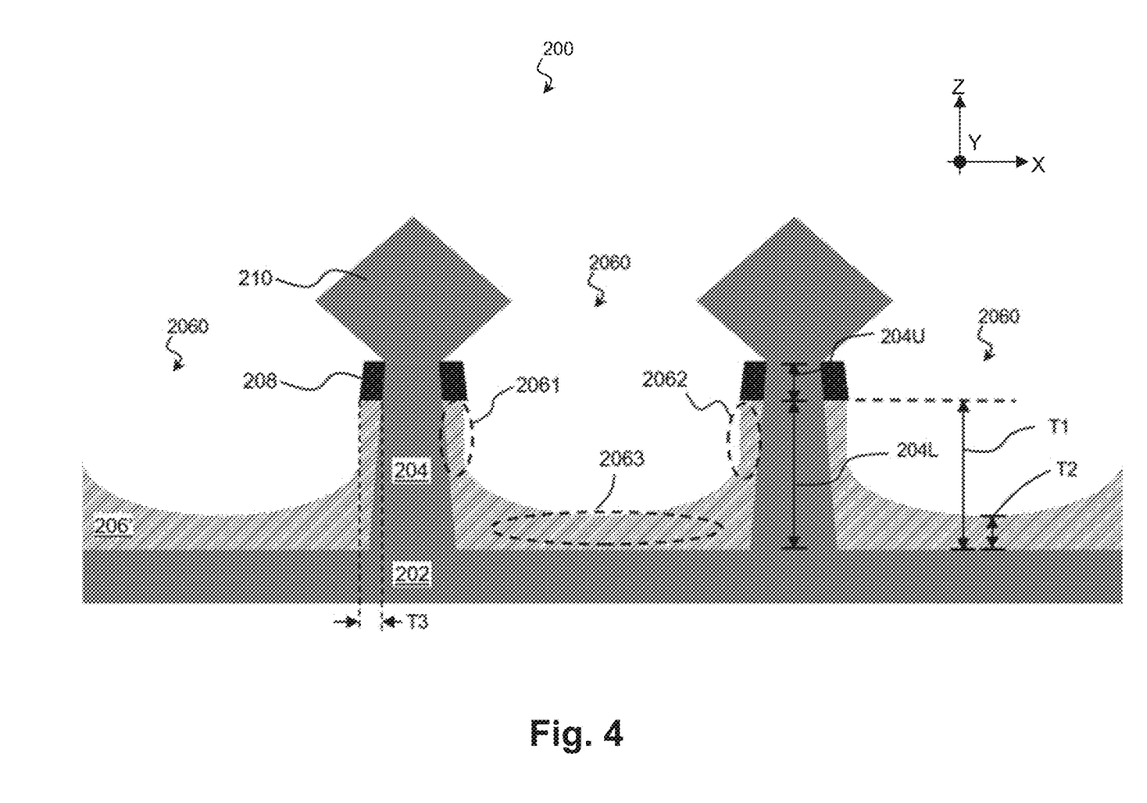

Referring now to FIGS. 1 and 4, the method 100 includes a block 106 where the first isolation layer 206 is recessed to form recessed first isolation layer 206'. In some embodiments, a portion of the first isolation layer 206 that is not covered by the spacer 208 is anisotropically and selectively etched to form a recess 2060. As illustrated in FIG. 4, the recess 2060 extends between two neighboring fin structures 204. The recessed first isolation layer 206' may be divided into two wall portions 2061 and 2062 that are disposed over sidewalls the lower portion 204L of the fins 204 and a bottom portion 2063 extending between the two wall portions 2061 and 2062. In some embodiments, the recessing at block 106 is performed using a chemistry that etches the first isolation layer 206 faster than it etches the spacer 208 and the source/drain feature 210. In some implementations, the recessing at block 106 may be a dry etch, a wet eth, or a combination thereof. It is noted that the first isolation layer 206 is not etched through at block 106 to expose either the substrate 202 or the fin structures 204 to prevent formation of any defects or leak paths. In this regard, the first spacer layer 206 has a first thickness T1 before block 106 and the recessed first spacer layer 206' has a second thickness T2 after block 106. In some instances, the second thickness T2 is about 5% and about 50% of the first thickness T1. Each of the two wall portions 2061 and 2062 may have a third thickness T3. In some instances, the third thickness T3 is about 1 nm and about 15 nm. As illustrated in FIG. 4, when viewed along the Y direction, the two wall portions 2061 and 2062 on both sides of the bottom portion 2063 rise above a top surface of the bottom portion 2063 along the Z direction, giving the recessed first isolation layer 206' a shape of the letter "U" or a U-shape. In other words, the surface of the bottom portion 2063 is lower than top surfaces of the two wall portions 2061 and 2062 along the Z direction.

Figure 5:
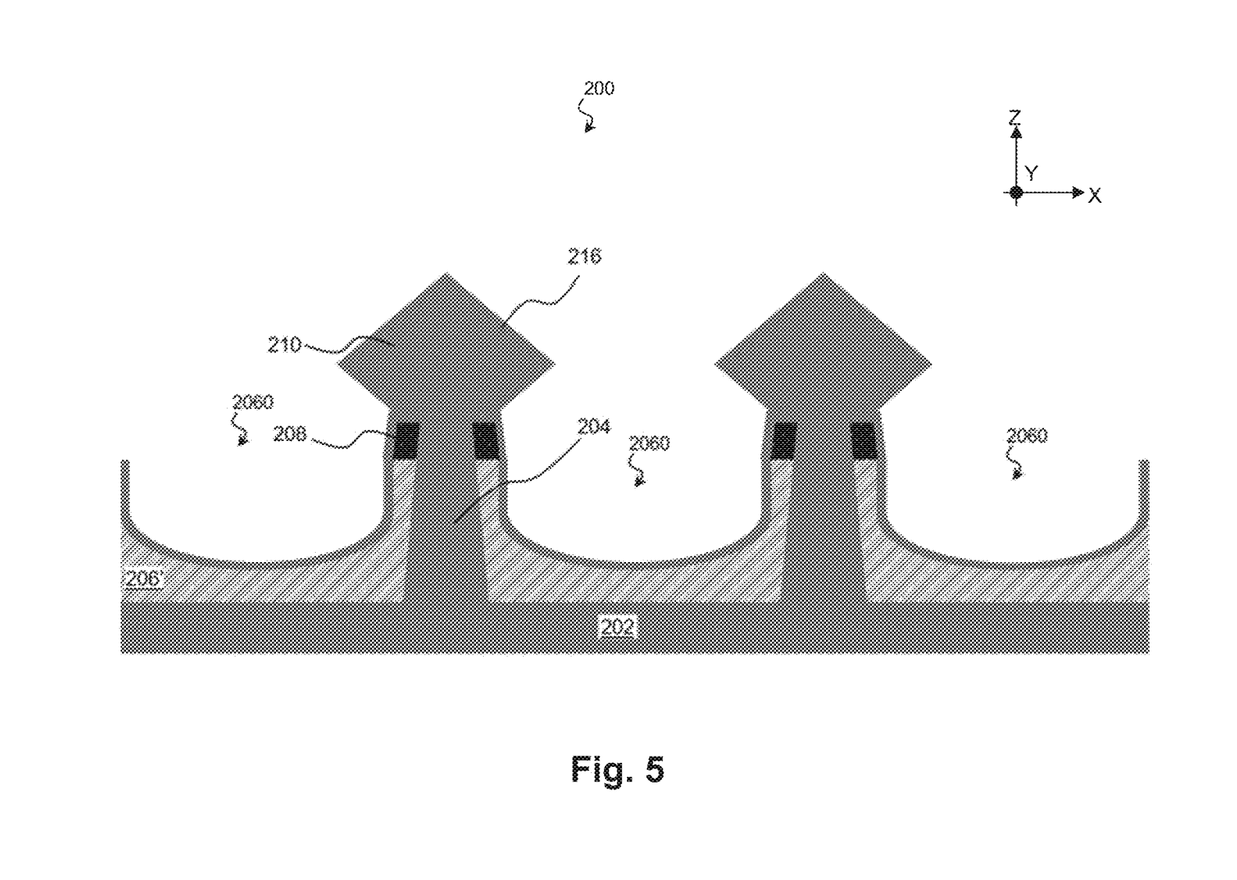

Referring now to FIGS. 1 and 5, the method 100 includes a block 108 where an etch stop layer 216 is deposited over the recessed first isolation layer 206' and the source/drain feature 210. In some embodiments, the etch stop layer 216 may be formed of silicon nitride, silicon oxycarbonitride, silicon oxycarbide, or other suitable dielectric material. In some implementations, the etch stop layer 216 has a different etching selectivity from the second isolation layer 218 to be deposited at block 110. As such, the etch stop layer 216 may slow down the etching process through the second isolation layer 218 when a source/drain contact via opening is to be formed through the second isolation layer 218. In some instances, the etch stop layer 216 may also be referred to as a contact etch stop layer 216 or CESL 216.

Figure 6:
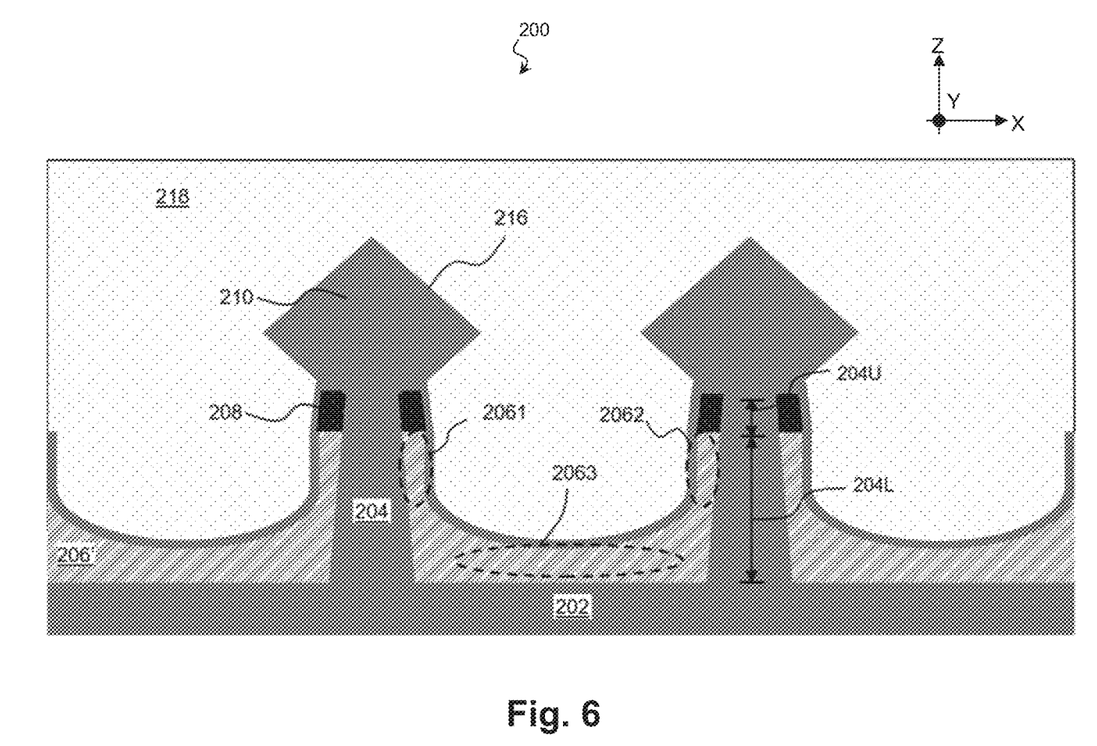

Referring now to FIGS. 1 and 6, the method 100 includes a block 110 where a second isolation layer 218 is formed over the etch stop layer 216. In some embodiments, the second isolation layer 218 has a composition that is different from the composition of the first isolation layer 206. In some implementations, the second isolation layer 218 may be formed using CVD, ALD, or other suitable deposition technique. In some instances, the second isolation layer 218 may be formed of a dielectric material that will shrink or condense in an anneal process. For example, some functional groups of the dielectric material may decompose or condense to produce volatile compounds that will leave the dielectric material. In some embodiments, the second isolation layer 218 may be formed of silicon oxide, silicon nitride, silicon oxynitride, silicon carbide, other suitable low-k materials. As illustrated in FIG. 6, a portion of the second isolation layer 218 is deposited within the recess 2060 that is lined by the etch stop layer 216 such that the etch stop layer 216 is disposed between the recessed first isolation layer 206' and the second isolation layer 218. In addition, in embodiments represented in FIG. 6, the lower portions 204L of two neighboring fin structures 204 are separated by two wall portions 2061 and 2062, two layers the etch stop layer 216, and the portion of the second isolation layer 218 that is deposited within and extends into the recess 2060. When the thickness of the recessed first isolation layer 206', such as the second thickness T2 and the third thickness T3, is minimized, the volume/thickness of the second isolation layer 218 that surrounds the fin structures 204 may be maximized. The maximization of the volume/thickness of the second isolation layer 218 maximizes the size of the structure that exerts stress on the fin structure 204, including the channel region 207 of the fin structure 204. After the second isolation layer 218 is deposited, a planarization process, such as a chemical mechanical process (CMP), may be performed to planarize the top surface of the second isolation layer 218. In this regard, the second isolation layer 218 may function as an interlayer dielectric (ILD) layer of an interconnect structure that includes multiple ILD layers, metal lines, and contact vias.

Figure 7:
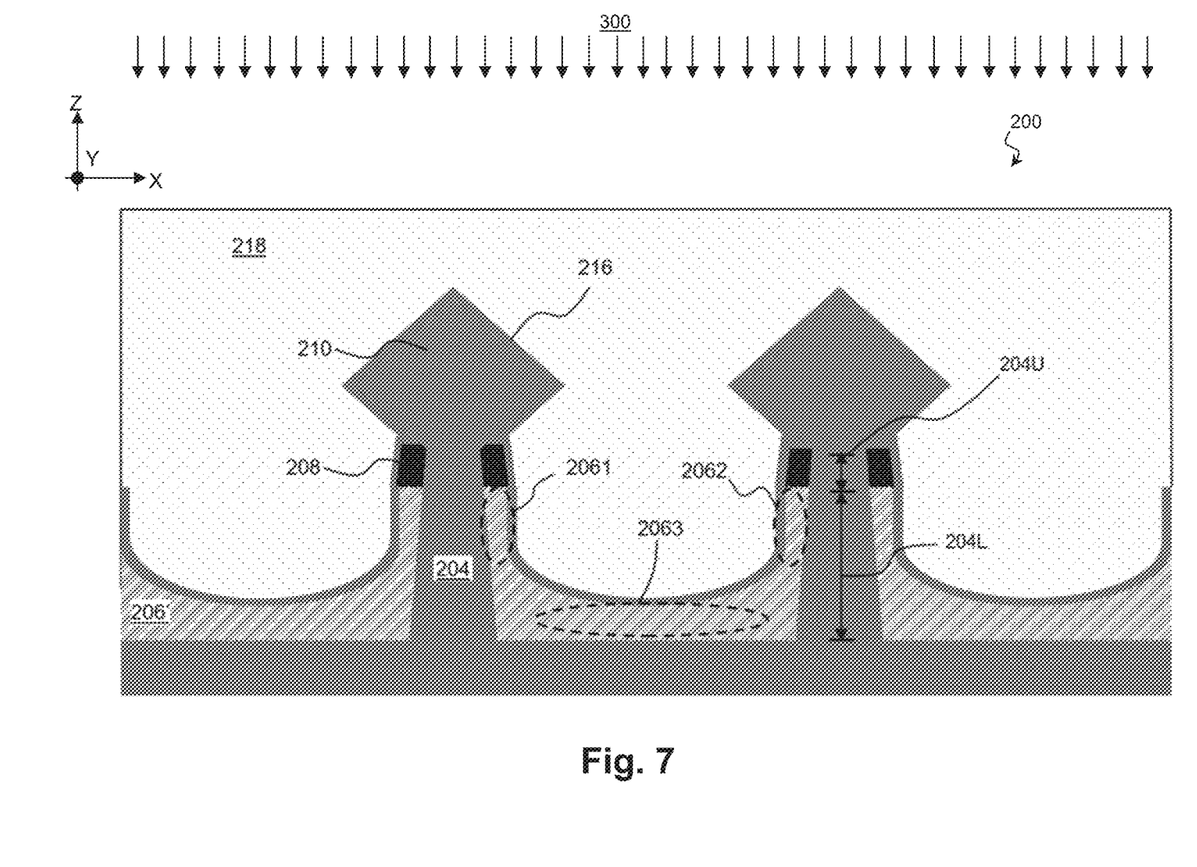

Referring now to FIGS. 1 and 7, the method 100 includes a block 112 where the second isolation layer 218 is annealed using an annealing process 300. In some embodiments, the workpiece 200 is annealed between about 500° C. and about 1200° C. to compressively strain the second isolation layer 218. The annealing process 300 may include a furnace annealing process, a rapid thermal annealing (RTA) process, a spike annealing process, a laser annealing process, or a combination thereof. Depending on the type of annealing technique used, the anneal process 300 may include different anneal times. In cases where the anneal process 300 is performed using a furnace annealing process, the anneal time may be between about 10 mins and about 5 hours. When an RTA process, a spike annealing process, or a rapid thermal annealing process is used, the anneal time may be measured with nano-seconds or seconds. In some implementations, the second isolation layer 218 includes one or more types of functional groups that may decompose or undergo condensation reactions during the annealing process 300 to produce a volatile compound that can be removed from the second isolation layer 218. Such functional groups may be referred to as leaving groups. Once the leaving groups leave the second isolation layer 218, the second isolation layer 218 may shrink in volume or become densified. The shrunken second isolation layer 218 is compressively strained and may exert a tensile stress on the features around it, including on the fin structure 204 wrapped around by the second isolation layer 218. The shrunken second isolation layer 218 may also exert a tensile stress on the channel region 207 of the fin structure 204 and such tensile stress has been observed to improve the performance of n-type devices due to increased electron mobility. In some other implementations, the second isolation layer 218 does not include any leaving group and the anneal process 300 may bring about desorption, bond formations, or bond rearrangements to compressively strain the second isolation layer 218. Some conventional techniques include utilizing the first isolation layer 206 as a compressively strained stressor structure. However, as the first isolation layer 206 is formed early in the process and has to endure much of the fabrication process, the compressive strain in the first isolation layer 206 may be relaxed in the process, making the first isolation layer 206 a less effective stressor structure. Unlike the first isolation layer 206, the second isolation layer 218 is deposited later in the process in an intentionally enlarged space to maximize its effectiveness as a stressor structure for improved performance.

Referring to FIGS. 1 and 8, the method 100 includes a block 114 where further processes are performed. Such further processes may include, for example, processes for forming the source/drain features in the p-type device region. For ease of comparison, cross-sectional diagrammatic views of source/drain regions of an n-type device region 1000 and a p-type device region 2000 are illustrated in FIG. 8. In some embodiments, after the source/drain features 210 in the n-type device region 1000 have been formed, another hard mask is deposited over the workpiece 200 and is patterned to expose the source/drain regions in the p-type device region 2000, while covering the rest of the workpiece 200. Unlike the n-type device region 1000 illustrated on the left-hand side, the first isolation layer 206 in the p-type device region 2000 is not recessed and its top surface remains planar and substantially parallel to the top surface of the substrate 202. That is, when view along the Y direction, the first isolation layer 206 in the p-type device region 2000 is not U-shaped like the recessed first isolation layer 206' in the n-type device region 1000. The source/drain feature in the p-type device region 2000 is denoted differently as 211 as it has a different epitaxial composition from that of the source/drain feature 210 in the n-type device region 1000. Similar to the n-type device region 1000, the p-type device region 2000 includes the etch stop layer 216 that is deposited over the first isolation layer 206, the spacer 208, and the source/drain feature 211. Due to the absence of the recess in the first isolation layer 206, an ILD layer 219 deposited in the p-type device region 2000 does not extend into the first isolation layer 206. In some embodiments, the ILD layer 219 has a composition that is different from the composition of the second isolation layer 218 and ILD layer 219 and is not intentionally designed to exert tensile stress on the fin structures 204 thereunder. For example, the ILD layer 219 may be formed of a material that neither includes any leaving group that may leave the ILD layer 219 nor densifies when it undergoes an annealing process. In some implementations, the ILD layer 219 may include silicon oxide, silicon nitride, silicon oxynitride, silicon oxycarbonitride, or silicon oxycarbide, or other suitable materials. To summarize, in some embodiments, the formation of the source/drain feature 211 in the p-type device region 2000 may not include any operations comparable to those in blocks 106 and 112 in method 100 of FIG. 1.

Such further processes may also include processes for forming source/drain contacts 220 illustrated in FIG. 8. In some embodiments, source/drain contact openings are first formed through the second isolation layer 218 in the n-type device region 1000 or the ILD layer 219 in the p-type device region 2000. Thereafter, a metal-containing barrier layer 222, such as tantalum nitride or titanium nitride, tungsten nitride, or cobalt nitride, may be deposited within the source/drain contact openings. The barrier layer 222 serves to prevent oxidation of source/drain contacts 220 due to oxygen diffusion from the second isolation layer 218 or the ILD layer 219. In some implementations, the workpiece 200 is then annealed to promote reaction between the source/drain features 210/211, on the one hand, and the barrier layer 222, on the other, to form a silicide layer 224 at the interface of the source/drain feature 210/211 and the barrier layer 222. In some instances, the barrier layer 222 that remains over the silicide layer 224 may be removed using a suitable etching technique so as to reduce contact resistance. A metal fill layer 226 may then be deposited to fill the source/drain contact opening to form the source/drain contact 220. A CMP may be performed to planarized top surfaces of the workpiece 200. In some embodiments, the metal fill layer 226 may include tantalum nitride (TaN), nickel silicide (NiSi), cobalt silicide (CoSi), molybdenum (Mo), copper (Cu), tungsten (W), aluminum (Al), nickel (Ni), cobalt (Co), zirconium (Zr), platinum (Pt), ruthenium (Ru), or other applicable materials.

Figure 9:
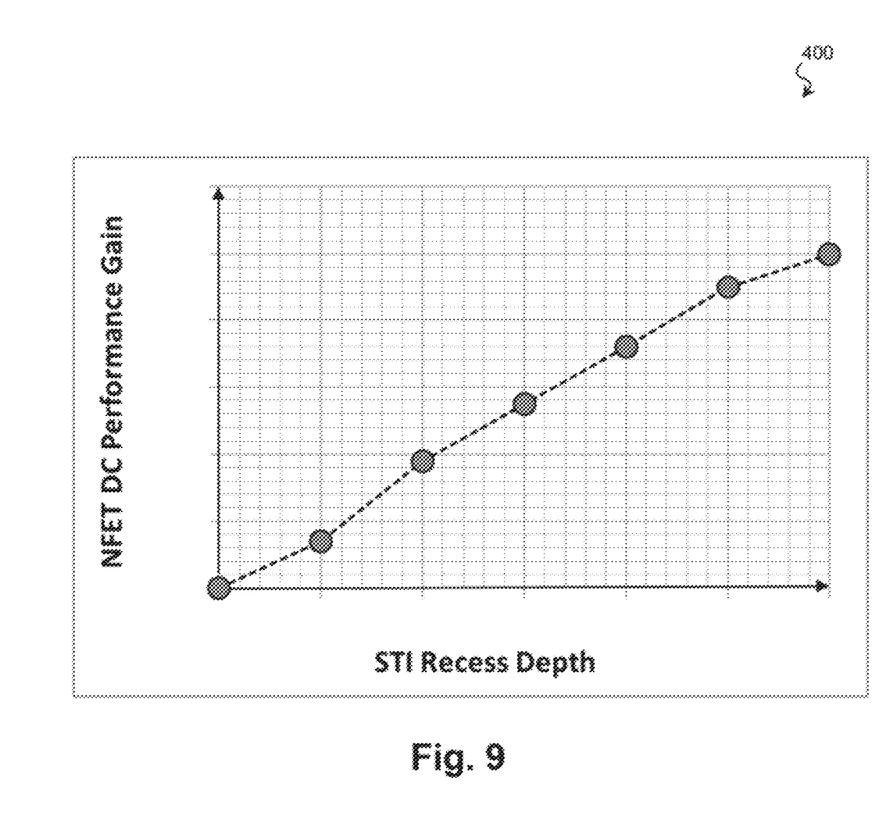
FIG. 9 is a chart showing drive current performance gain in an n-type FinFET in relation to a recess depth into shallow trench isolation (STI), according to various aspects of the present disclosure.

Reference is now made to FIG. 9, which illustrates a chart 400. Chart 400 shows drive current (referred to as "DC" in FIG. 9) performance gain of an n-type FinFET in relation to a depth of recess into the STI, which corresponds to the recess 2060 in FIG. 4. As described above, because the recess 2060 into the first isolation layer 206 makes room for the second isolation layer 218 which is later strained by annealing, FIG. 9 may also be viewed as charting drive current performance gain of an n-type FinFET device in relation to the volume of strained second isolation layer 218. FIG. 9 is based on Technology Computer-Aided Design (TCAD) simulation results and illustrates that drive currents (which may be referred to as $I_{on}$) can be improved when larger volume of second isolation layer 218 replaces the first isolation layer 206 and is annealed to be strained. As illustrated in FIG. 9, in some instances, when the STI recess depth is about 60 nm, the drive current of the n-type FinFET may increase by about 5%.

Thus, the various embodiments described herein offer several advantages over the existing art. For example, the semiconductor device of the present disclosure includes an n-type device region and a p-type device region. In the n-type device region, a first isolation layer (STI) is recessed to have a U-shape to make room for a second isolation layer and the second isolation layer is annealed to become compressively strained. The compressively strained second isolation layer wraps around a fin structure and serves as a stressor structure that exert a tensile stress on a channel region of the fin structure. The tensile stress improves the electron mobility in the channel region of the fin in the n-type device region, thereby increasing the performance of the n-type device. The same stressor structure is not fabricated in the p-type device region. The compressively strained second isolation layer in the n-type device region is an effective stressor structure and is less likely to suffer strain relaxation in the course of fabrication of the semiconductor device. It will be understood that not all advantages have been necessarily discussed herein, no particular advantage is required for all embodiments, and other embodiments may offer different advantages. Additional embodiments and advantages will be evident to those skilled in the art in possession of this disclosure.

In one exemplary aspect, the present disclosure is directed to a semiconductor device. The semiconductor device includes a first fin including a first source/drain region, a second fin including a second source/drain region, a first isolation layer disposed between the first source/drain region and the second source/drain region, and a second isolation layer disposed over the first isolation layer. A first portion of the first isolation layer is disposed on sidewalls of the first source/drain region and a second portion of the first isolation layer is disposed on sidewalls of the second source/drain region. A portion of the second isolation layer is disposed between the first portion and second portion of the first isolation layer.

In some embodiments, the semiconductor device further includes an etch stop layer disposed between the first isolation layer and the second isolation layer. In some embodiments, the semiconductor device may further include a spacer. The first portion of the spacer is disposed over the first portion of the first isolation layer and a second portion of the spacer is disposed over the second portion of the first isolation layer. In some implementations, the semiconductor device may further include an etch stop layer disposed over and in contact with the first and second portions of the spacer and the first isolation layer. The second isolation layer is disposed over and in contact with the etch stop layer. In some instances, the semiconductor device further includes a substrate. The first and second fins are connected to and extend from the substrate. The first isolation layer further includes a bottom portion extending between the first portion and the second portion. The top surfaces of the first and second portions have a first height measured from a top surface of the substrate. A top surface of the bottom portion has a second height measured from the top surface of the substrate. The first second height is between about 5% and about 50% of the second first height. In some embodiments, the first isolation layer is U-shaped. In some implementations, a composition of the first isolation layer is different from a composition of the second isolation layer.

In one exemplary aspect, the present disclosure is directed to a semiconductor device. The semiconductor device includes an n-type device region and a p-type device region. The n-type device region includes a first fin including a first source/drain region, a second fin including a second source/drain region, a first isolation layer disposed between the first source/drain region and the second source/drain region, and a second isolation layer disposed over the first isolation layer. The p-type device region includes a third fin including a third source/drain region, a fourth fin including a fourth source/drain region, and the first isolation layer disposed between the third source/drain region and the fourth source/drain region. In the n-type device region, a portion of the second isolation layer extends into the first isolation layer between the first and second source/drain regions.

In some embodiments, the first isolation layer in the n-type device region is U-shaped. In some embodiments, a top surface of the first isolation layer in the p-type device region is substantially planar. In some implementations, the semiconductor device may further include an etch stop layer disposed between the first isolation layer and the second isolation layer. In some instances, the first fin has a lower portion in contact with the first isolation layer and the second fin has a lower portion in contact with the first isolation layer. In addition, a portion of the first isolation layer and the portion of the second isolation layer that extends into the first isolation layer are disposed between the lower portion of the first fin and the lower portion of the second fin. In some embodiments, a portion of the etch stop layer is disposed between the lower portion of the first fin and the lower portion of the second fin. In some implementations, the n-type device region further includes a spacer. The first fin has an upper portion over the lower portion the first fin and the second fin has an upper portion over the lower portion of the second fin. The spacer is in contact with the upper portion of the first fin and the upper portion of the second fin. In some instances, the third fin has a lower portion in contact with the first isolation layer and the fourth fin has a lower portion in contact with the first isolation layer. The lower portion of the third fin and the lower portion of the fourth fin are separated only by the first isolation layer.

In another exemplary aspect, the present disclosure is directed to a method. The method includes providing a workpiece. The workpiece includes a first fin in an n-type device region, a second fin in the p-type device region, and a dielectric layer. The first fin extends through a first isolation layer and includes a first source/drain region. The second fin extends through the first isolation layer and includes a second source/drain region. The dielectric layer is disposed over the first fin, the second fin and the first isolation layer. The method further includes etching the first isolation layer in the n-type device region to form a recess in the first isolation layer in the n-type device region; and depositing a second isolation layer over the first isolation layer and in the recess. A composition of the first isolation layer is different from a composition of the second isolation layer.

In some embodiments, the method may further include depositing an etch stop layer before the depositing of the second isolation layer. In some embodiments, the method may further include annealing the second isolation layer to impart a tensile stress on the first fin. In some implementations, the providing of the workpiece includes depositing a spacer material over the first fin, the second fin and the first isolation layer; and recessing the spacer material deposited over top surfaces of the first fin, the second fin and the first isolation layer to form spacers in contact with sidewalls of the first and second fins. The etching of the first isolation layer to form the recess in the first isolation layer in the n-type device region includes using the spacers as an etch mask. In some implementations, the method further includes depositing an etch stop layer over the etched first isolation layer and within the recess in the n-type device region.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A device comprising:
    a first fin and a second fin disposed on a substrate;
    a first source/drain feature disposed on the first fin and extending to a first height over the substrate;
    a second source/drain feature disposed on the second fin;
    a first isolation layer disposed between the first source/drain feature and the second source/drain feature;
    a second isolation layer disposed over the first isolation layer; and
    an etch stop layer disposed between the first isolation layer and the second isolation layer such that the etch stop layer prevents the second isolation layer from interfacing with the first isolation layer, and
    wherein a portion of the second isolation layer extends into a recess defined by the first isolation layer between the first and second source/drain features, wherein the portion of the second isolation layer further extends between the first and second source/drain features to a second height that is greater than the first height of the first source/drain feature.

2. The device of claim 1, wherein the second source/drain feature extends to the first height over the substrate.

3. The device of claim 1, wherein the first isolation layer includes:
    a first portion interfacing with a sidewall of the first fin;
    a second portion interfacing with a sidewall of the second fin; and
    a third portion disposed between the first and second portions and interfacing with the substrate, the third portion being at a lower level within the device than the first and second portions.

4. The device of claim 1, further comprising a sidewall spacer disposed along and interfacing with a sidewall of the first fin, and
    wherein the first isolation layer interfaces with the sidewall spacer and the second isolation layer does not interface with the sidewall spacer.

5. The device of claim 4, wherein the etch stop layer interfaces with the sidewall spacer.

6. The device of claim 1, further comprising:
    a third fin disposed on a substrate;
    a third source/drain feature disposed on the third fin;
    a third isolation layer disposed on the substrate, the third fin at least partially embedded within the third isolation layer, the third isolation layer having a planar top surface extending laterally away from the third fin at least beyond the outer boundary of the third source/drain feature, the planar top surface being substantially parallel to a top surface of the substrate.

7. The device of claim 6, wherein the substrate includes a first region associated with a first device having a first-type of conductivity and a second region associated with a second device having a second-type of conductivity, the second-type of conductivity being opposite the first-type of conductivity, and wherein the first isolation layer disposed between the first source/drain feature and the second source/drain feature is associated with the first device and the third isolation layer is associated with the second device.

8. A device comprising:

a first semiconductor fin structure disposed on a substrate;

a second semiconductor fin structure disposed on the substrate;

a first source/drain feature disposed on the first semiconductor fin structure;

a second source/drain feature disposed on the second semiconductor fin structure;

a first shallow trench isolation structure extending from the first semiconductor fin structure to the second semiconductor fin structure, the first shallow trench isolation structure having a concave top surface defining a recess;

a first etch stop layer extending from the first source/drain feature to the second source/drain feature, the first etch stop layer disposed within the recess defined by the concave top surface of the shallow trench isolation structure; and an isolation layer disposed within the recess and extending to a greater height above the substrate than the first source/drain feature.

9. The device of claim 8, wherein the first etch stop layer interfaces with the concave top surface of the shallow trench isolation structure, and wherein the isolation layer interfaces with the first etch stop layer in the recess.

10. The device of claim 8, wherein the first etch stop layer is positioned between the isolation layer and the concave top surface of the first shallow trench isolation structure such that the first etch stop layer prevents the isolation layer from interfacing with the concave top surface of the shallow trench isolation structure.

11. The device of claim 8, wherein the isolation layer is formed of a different material than the shallow trench isolation structure.

12. The device of claim 8, wherein the substrate includes an n-type device region, and wherein the first shallow trench isolation structure extending from the first semiconductor fin structure to the second semiconductor fin structure is disposed on the n-type device region of the substrate.

13. The device of claim 8, further comprising:

a third semiconductor fin structure disposed on a substrate;

a third source/drain feature disposed on the third semiconductor fin structure;

a second shallow trench isolation structure disposed on the substrate, the third semiconductor fin structure at least partially embedded within the second shallow trench isolation structure, the second shallow trench isolation structure having a planar top surface extending laterally away from the third semiconductor fin structure, the planar top surface being substantially parallel to a top surface of the substrate;

a second etch stop layer disposed directly on the planar top surface; and an interlayer dielectric layer disposed directly on the second etch stop layer.

14. The device of claim 8, wherein the substrate includes a p-type device region, and wherein the second shallow trench isolation structure is disposed on the n-type device region of the substrate.

15. A device comprising:

a first fin and a second fin disposed on a substrate;

a first source/drain feature disposed on the first fin;

a second source/drain feature disposed on the second fin;

a first dielectric layer extending from the first fin to the second fin, the first dielectric layer defining a u-shaped recess;

a second dielectric layer extending from the first source/drain feature to the second source/drain feature, the second dielectric layer disposed within the u-shaped recess defined by the first dielectric layer; and a third dielectric layer disposed within the u-shaped recess and extending over the first source/drain feature and the second source/drain feature, and wherein the first dielectric layer includes:

a first portion interfacing with a sidewall of the first fin and having a first thickness;

a second portion interfacing with a sidewall of the second fin and having a second thickness; and a third portion disposed between the first and second portions and interfacing with the substrate, the third portion having a third thickness that is less than the first thickness and the second thickness.

16. The device of claim 15, wherein the second dielectric layer interfaces with the first dielectric layer, and wherein the third dielectric layer interfaces with the second dielectric layer.

17. The device of claim 15, further comprising a dielectric sidewall spacer disposed on the first fin such that the dielectric sidewall spacer interfaces with the first fin.

18. The device of claim 17, wherein the first dielectric layer and the second dielectric layer interface with the dielectric sidewall spacer.

19. The device of claim 15, wherein the second dielectric layer extends over the first source/drain feature such that the second dielectric layer is positioned between the third dielectric layer and the first source/drain feature.

20. The device of claim 15, wherein second dielectric layer is disposed between the first dielectric layer and the third dielectric layer such that the second dielectric layer prevents the third dielectric layer from interfacing with the first dielectric layer.

* * * * *